(12) United States Patent
Yamano et al.

(10) Patent No.: US 10,763,252 B2
(45) Date of Patent: Sep. 1, 2020

(54) SEMICONDUCTOR DEVICE

(71) Applicant: FUJI ELECTRIC CO., LTD., Kawasaki-shi, Kanagawa (JP)

(72) Inventors: Akio Yamano, Matsumoto (JP); Misaki Takahashi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/883,537

(22) Filed: Jan. 30, 2018

(65) Prior Publication Data
US 2018/0269202 A1 Sep. 20, 2018

(30) Foreign Application Priority Data

Mar. 15, 2017 (JP) ................. 2017-050653

(51) Int. Cl.
| | |
|---|---|
| *H01L 27/06* | (2006.01) |
| *H01L 29/739* | (2006.01) |
| *H01L 29/861* | (2006.01) |
| *H01L 29/40* | (2006.01) |
| *H01L 29/10* | (2006.01) |
| *H01L 29/06* | (2006.01) |

(Continued)

(52) U.S. Cl.
CPC ...... *H01L 27/0664* (2013.01); *H01L 27/0727* (2013.01); *H01L 29/0638* (2013.01); *H01L 29/0696* (2013.01); *H01L 29/0834* (2013.01); *H01L 29/1095* (2013.01); *H01L 29/36* (2013.01); *H01L 29/407* (2013.01); *H01L 29/7397* (2013.01); *H01L 29/8613* (2013.01); *H01L 29/45* (2013.01)

(58) Field of Classification Search
CPC ............. H01L 27/0664; H01L 27/0727; H01L 29/0696; H01L 29/0834; H01L 29/0638; H01L 29/407; H01L 29/8613; H01L 29/7397; H01L 29/1095
See application file for complete search history.

(56) References Cited

U.S. PATENT DOCUMENTS

| | | |
|---|---|---|
| 5,360,984 A | 11/1994 | Kirihata |
| 6,054,748 A | 4/2000 | Tsukuda et al. |
| (Continued) | | |

FOREIGN PATENT DOCUMENTS

| | | |
|---|---|---|
| JP | H05-152574 A | 6/1993 |
| JP | H10-321877 A | 12/1998 |
| (Continued) | | |

*Primary Examiner* — Jarrett J Stark
(74) *Attorney, Agent, or Firm* — Rabin & Berdo, P.C.

(57) ABSTRACT

A semiconductor device including a semiconductor substrate and a plurality of trench structures formed on the semiconductor substrate. The semiconductor substrate includes a first element region for forming an insulated gate bipolar transistor therein, and a second element region for forming a diode therein, the semiconductor substrate constituting a drift layer. The plurality of trench structures includes a plurality of gate trench structures provided on a front surface side of the first element region, each gate trench structure having an electrode provided therein that is based on a gate potential, and a plurality of floating trench structures provided on a front surface side of the second element region, each floating trench structure having an electrode provided therein that has a floating potential.

8 Claims, 12 Drawing Sheets

(51) Int. Cl.
  *H01L 29/08*   (2006.01)
  *H01L 27/07*   (2006.01)
  *H01L 29/36*   (2006.01)
  *H01L 29/45*   (2006.01)

(56) References Cited

U.S. PATENT DOCUMENTS

| | | | | |
|---|---|---|---|---|
| 6,936,890 | B2* | 8/2005 | Hueting | H01L 29/0696 257/330 |
| 8,120,104 | B2* | 2/2012 | Fujii | H01L 29/739 257/139 |
| 8,304,829 | B2* | 11/2012 | Yedinak | H01L 29/7397 257/334 |
| 8,866,222 | B2* | 10/2014 | Weber | H01L 29/7816 257/340 |
| 9,123,769 | B2* | 9/2015 | Kim | H01L 29/66333 |
| 9,691,844 | B2* | 6/2017 | Kim | H01L 29/0619 |
| 10,026,728 | B1* | 7/2018 | Agam | H01L 27/0259 |
| 2012/0043581 | A1 | 2/2012 | Koyama et al. | |
| 2012/0132954 | A1* | 5/2012 | Kouno | H01L 29/0619 257/140 |
| 2015/0206960 | A1 | 7/2015 | Hirabayashi et al. | |
| 2015/0262999 | A1* | 9/2015 | Ogura | H01L 29/7397 257/140 |
| 2015/0295042 | A1 | 10/2015 | Kameyama et al. | |
| 2015/0349103 | A1* | 12/2015 | Onozawa | H01L 29/7397 257/144 |
| 2016/0172471 | A1* | 6/2016 | Hirabayashi | H01L 29/7397 257/124 |
| 2016/0268181 | A1* | 9/2016 | Yasuhara | H01L 29/51 |
| 2016/0284825 | A1 | 9/2016 | Onozawa | |
| 2017/0047322 | A1 | 2/2017 | Yoshida et al. | |
| 2017/0077216 | A1* | 3/2017 | Kouno | H01L 29/32 |
| 2017/0162662 | A1* | 6/2017 | Naito | H01L 23/528 |
| 2017/0200784 | A1* | 7/2017 | Shirakawa | H01L 21/2252 |
| 2017/0250269 | A1* | 8/2017 | Sumitomo | H01L 27/0635 |
| 2017/0263603 | A1* | 9/2017 | Hata | H01L 29/7397 |
| 2018/0190649 | A1* | 7/2018 | Laven | H01L 29/7397 |
| 2018/0190805 | A1* | 7/2018 | Liu | H01L 29/423 |
| 2018/0226399 | A1* | 8/2018 | Tamaki | H01L 27/0664 |
| 2018/0226487 | A1* | 8/2018 | Oota | H01L 29/7396 |
| 2018/0269202 | A1* | 9/2018 | Yamano | H01L 29/36 |
| 2018/0277667 | A1* | 9/2018 | Sekiguchi | H01L 21/28518 |
| 2018/0308839 | A1* | 10/2018 | Takahashi | H01L 29/7396 |
| 2019/0027591 | A1* | 1/2019 | Naito | H01L 27/0727 |

FOREIGN PATENT DOCUMENTS

| | | |
|---|---|---|
| JP | 2012-043890 A | 3/2012 |
| JP | 2015-138789 A | 7/2015 |
| JP | 5924420 B2 | 5/2016 |
| JP | 2016-174029 A | 9/2016 |
| WO | WO-2014/097454 A1 | 6/2014 |
| WO | WO-2015/190579 A1 | 12/2015 |
| WO | WO-2016/080269 A1 | 5/2016 |

* cited by examiner

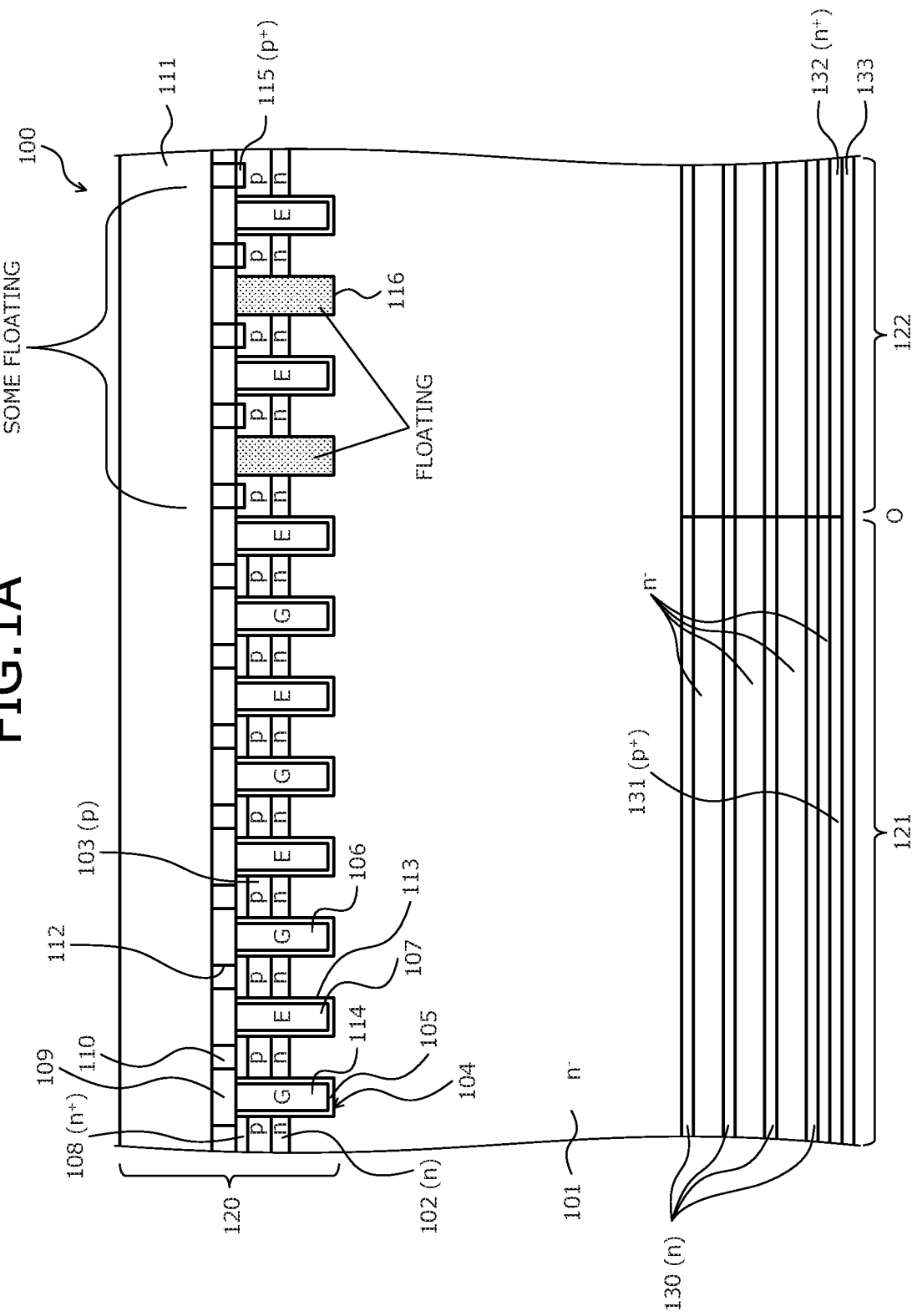

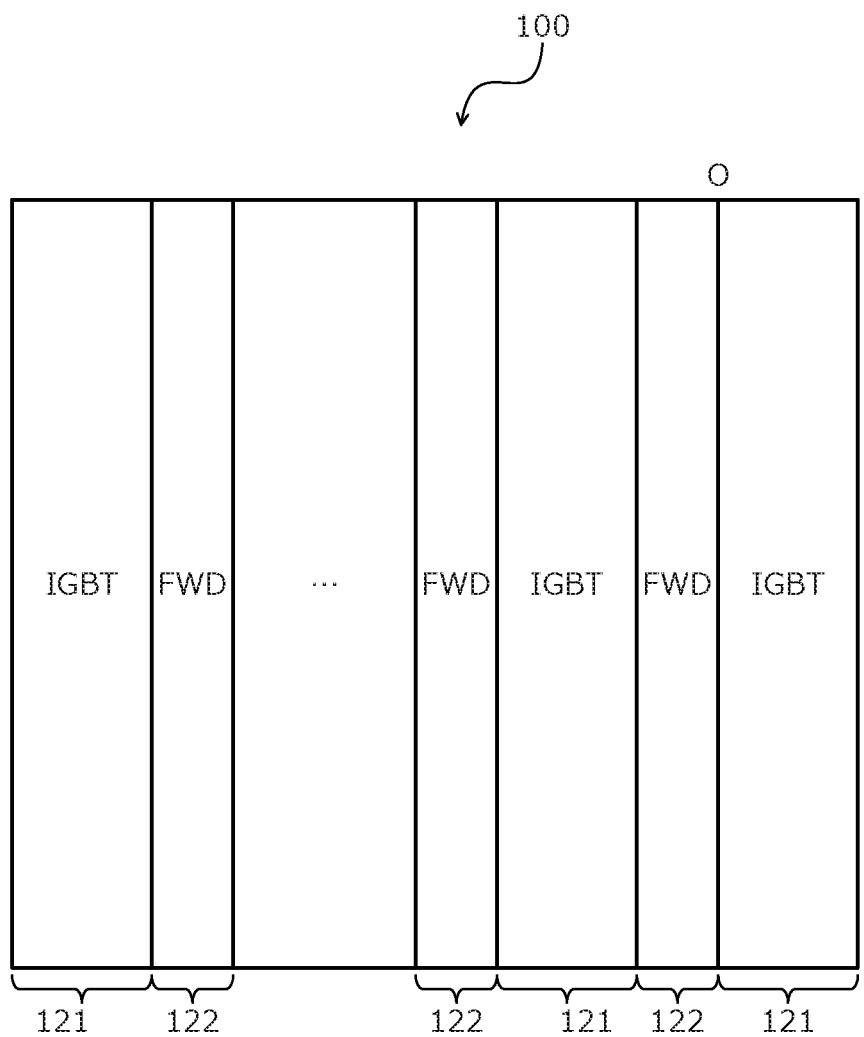

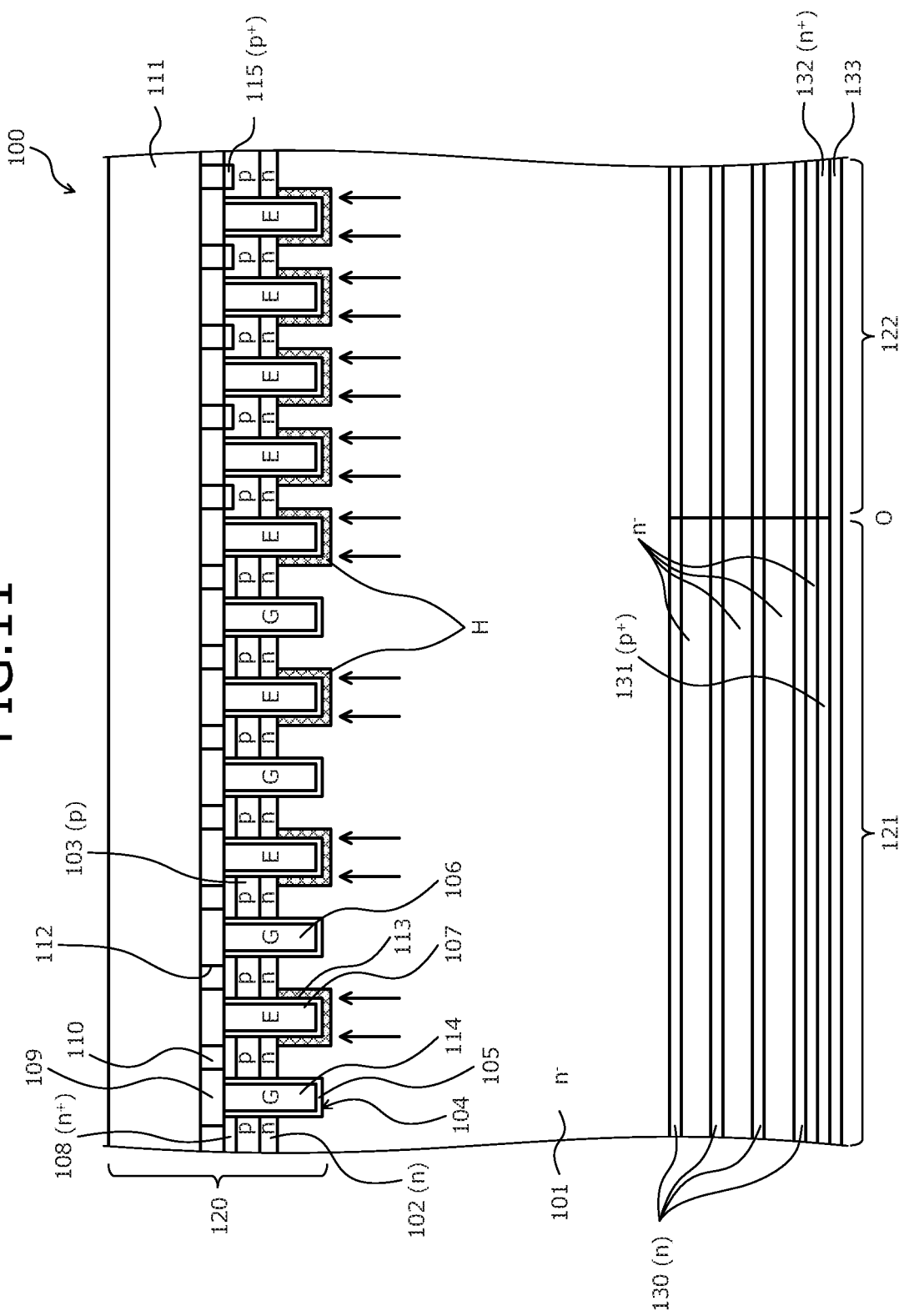

SEMICONDUCTOR DEVICE

CROSS REFERENCE TO RELATED APPLICATIONS

This application is based upon and claims the benefit of priority of the prior Japanese Patent Application No. 2017-050653, filed on Mar. 15, 2017, the entire contents of which are incorporated herein by reference.

BACKGROUND OF THE INVENTION

1. Field of the Invention

Embodiments of the invention related to a semiconductor device used in power converting equipment.

2. Description of the Related Art

Improvement of the characteristics of 600V, 1200V, and 1700V power semiconductor devices such as insulated gate bipolar transistors (IGBTs) or free wheeling diodes (FWDs) is advancing. Such power semiconductor devices are used in power converting equipment such as highly-efficient and power-saving inverters and are important for motor control.

In order to reduce the size of power converting equipment (relevant chips including an IGBT) overall, the development of a reverse conducting-IGBT (RC-IGBT) having a structure in which an IGBT and an FWD connected in anti-parallel with the IGBT are incorporated integrally on a single semiconductor chip has also advanced (for example, see International Publication No. WO 2016/080269).

A conventional technique discloses a structure of an RC-IGBT including plural first gate trenches arranged in a width direction of an IGBT region and plural second gate trenches extending in a direction intersecting with the first gate trenches, in which the first gate trenches and the second gate trenches are not in contact with each other (for example, see Japanese Laid-Open Patent Publication No. 2015-138789). A conventional configuration in which an on-potential is applied only to electrodes of either the first gate trenches or the second gate trenches and the other electrodes are caused to float has been disclosed.

SUMMARY OF THE INVENTION

According to an embodiment of the present invention, a semiconductor device includes a first element region in which an insulated gate bipolar transistor is provided; a second element region in which a diode is provided, the first element region and the second element region being located on a semiconductor substrate constituting a drift layer of a first conductivity type; gate trench structures provided on a front surface side of the first element region; and floating trench structures provided on a front surface side of the second element region. The gate trench structures each has an electrode based on a gate potential, the electrode being provided in the gate trench structures. The floating trench structures each has an electrode having a floating potential, the electrode being provided in the floating trench structures.

In the embodiment, each of a plurality of trench structures including the gate trench structures and the floating trench structures includes a trench and an insulating film provided in the trench, the electrode being provided on the insulating film.

In the embodiment, the trench structures further include emitter trench structures provided on the front surface side of the second element region. The emitter trench structures each has an electrode based on an emitter potential, the electrode being provided in the emitter trench structures.

In the embodiment, the semiconductor device further includes an interlayer insulating film provided on the trench structures in the first element region and the second element region, and an emitter electrode provided on the interlayer insulating film. The interlayer insulating film includes contact holes. The emitter trench structures have end portions connected with the emitter electrode by the contact holes. The floating trench structures are insulated from the emitter electrode by the interlayer insulating film.

In the embodiment, the semiconductor device further includes a collector electrode on a rear surface of the semiconductor substrate. A gate capacitance $CdsT$ between the emitter trench structures and the floating trench structures, and the collector electrode satisfies $CdsT/CdsT_0 \leq \frac{3}{4}$ where a gate capacitance in a case where only the first element region is provided in the semiconductor device and the trench structures in the first element region are all the emitter trench structures is $CdsT_0$.

In the embodiment, the emitter trench structures or the floating trench structures are provided also in the first element region.

In the embodiment, the first element region includes a base region of a second conductivity type provided between the trench structures that are adjacent in the first element region, and an emitter region of the first conductivity type provided on the base region.

In the embodiment, the floating trench structures are larger in number in the second element region than in the first element region.

In the embodiment, the semiconductor device further includes a channel-stop layer of the first conductivity type, an impurity concentration of the channel-stop layer being higher than an impurity concentration of the drift layer only in the first element region, or in the first element region and the second element region on a front surface side of the drift layer.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 1A and 1B are sectional views depicting a configuration example of an RC-IGBT according to a first embodiment;

FIG. 2 is a plan view of the RC-IGBT according to the first embodiment;

FIG. 11 is a sectional view for explaining a problem of the RC-IGBT according to the comparative example.

DETAILED DESCRIPTION OF THE INVENTION

Figure 1B:
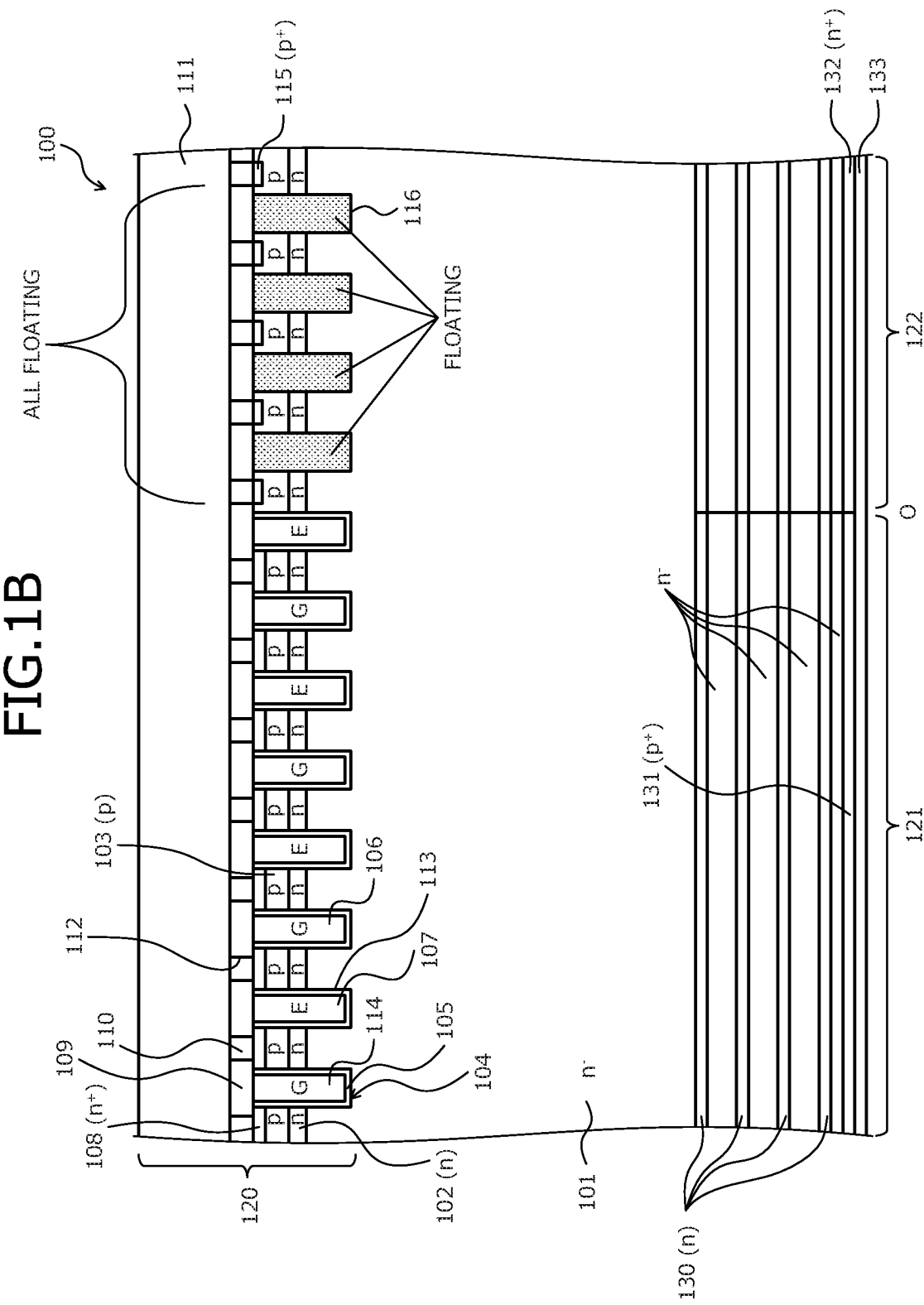

The conventional RC-IGBT has a problem in that the voltage at the time of turn-on has a tailing shape and turn-on power loss Eon becomes larger than that of a semiconductor device including an IGBT and an FWD separately.

Embodiments according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The following embodiments are described assuming that an n-type is a first conductivity type and a p-type is a second conductivity type.

A configuration of an RC-IGBT according to a comparative example is described using, as an example, a configuration of an active region in which an IGBT and an FWD are incorporated and integrated on a single semiconductor chip.

Figure 8:
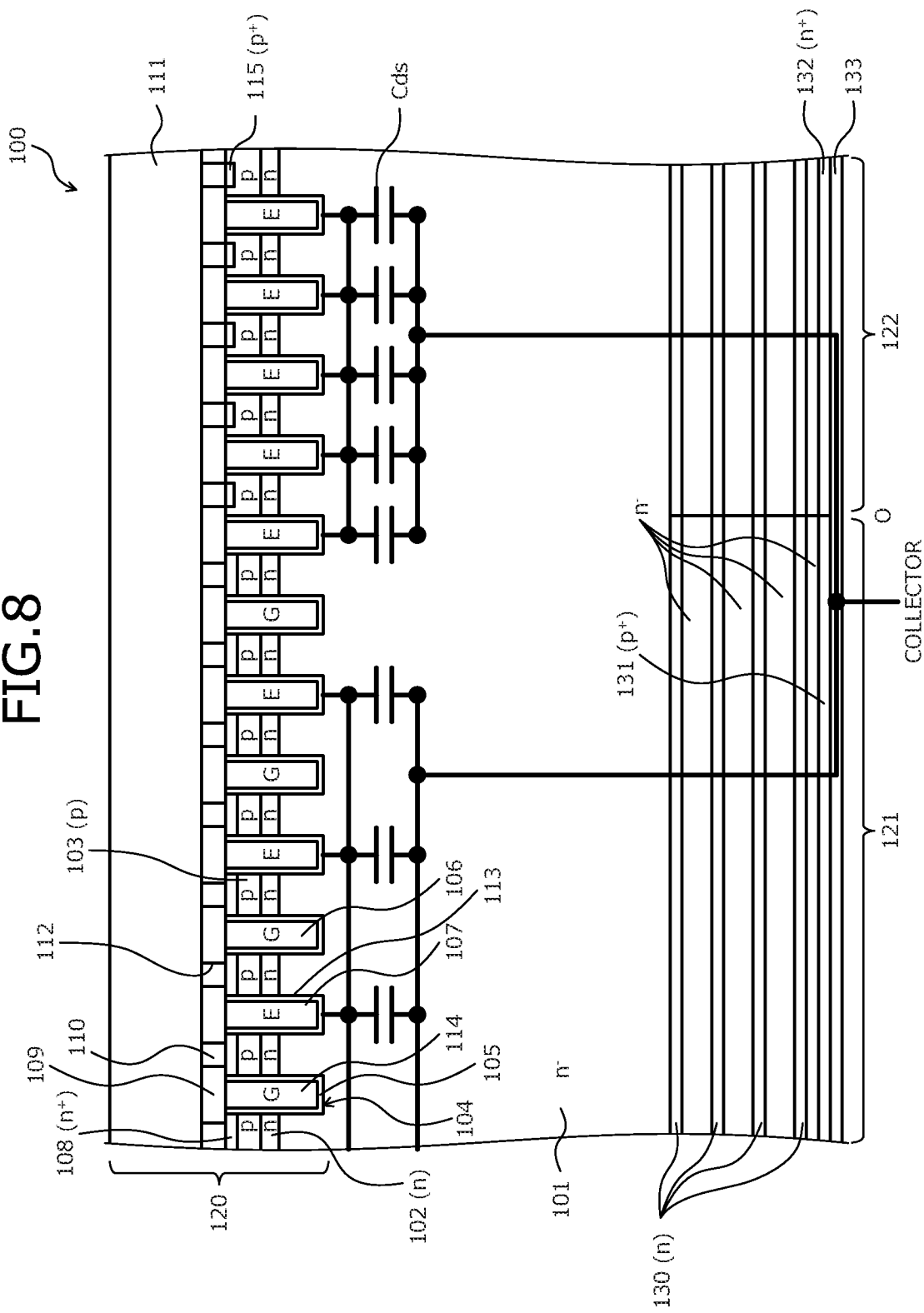
FIG. 8 is a sectional view of a configuration of a RC-IGBT according to a comparative example.

FIG. 8 is a sectional view of a configuration of the RC-IGBT according to the comparative example. In the RC-IGBT of the comparative example, as depicted in FIG. 8, IGBT regions 121 and FWD regions 122 are provided adjacently with boundaries O interposed therebetween. The boundaries O are, for example, boundaries between $p^+$-type collector regions 131 and $n^+$-type cathode regions 132. In each of the IGBT regions 121, a MOS (metal-oxide-semiconductor) gate (an insulated gate including a metal-oxide-semiconductor) structure 120 of a trench gate type is provided on a front surface of an $n^-$-type semiconductor substrate constituting an $n^-$-type drift layer 101. A collector electrode 133 is provided on a rear surface of the semiconductor substrate.

The MOS gate structure 120 includes plural trench structures 104, n-type regions 102, p-type base regions 103, $n^+$-type emitter regions 108, an interlayer insulating film 109 including contact holes 112, and an emitter electrode 111, and the contact holes 112 are filled with contact plugs 110 of tungsten (W) or the like. Each of the trench structures 104 includes a trench 113, an insulating film 105 provided in the trench 113, and an electrode 114 provided on the insulating film 105. The trench structures 104 include gate trench structures 106 each including the electrode 114 based on a gate potential, and emitter trench structures 107 each including the electrode 114 based on an emitter potential.

The gate trench structures 106 and the emitter trench structures 107 are formed in the IGBT regions 121. For example, the gate trench structures 106 and the emitter trench structures 107 are alternately arranged. Each of the gate trench structures 106 has, for example, a structure in which the electrode 114 of polycrystalline silicon is embedded, via the insulating film 105. Each of the emitter trench structures 107 also has, for example, a structure in which the electrode 114 of polycrystalline silicon is embedded, via the insulating film 105.

Figure 9:
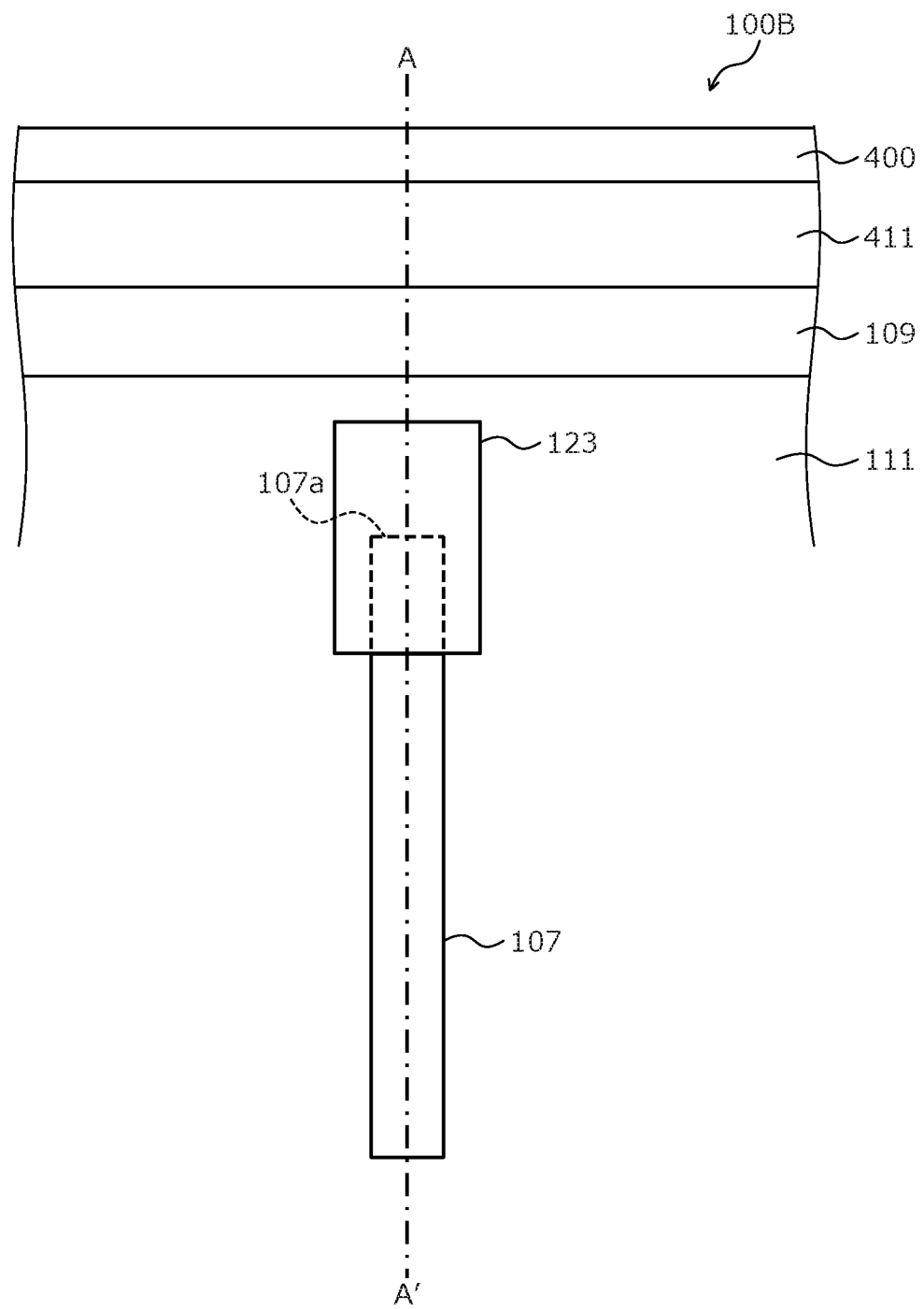
FIGS. 9 and 10 are schematic diagrams of an end portion of an emitter trench structure in the RC-IGBT according to the comparative example.
Figure 10:
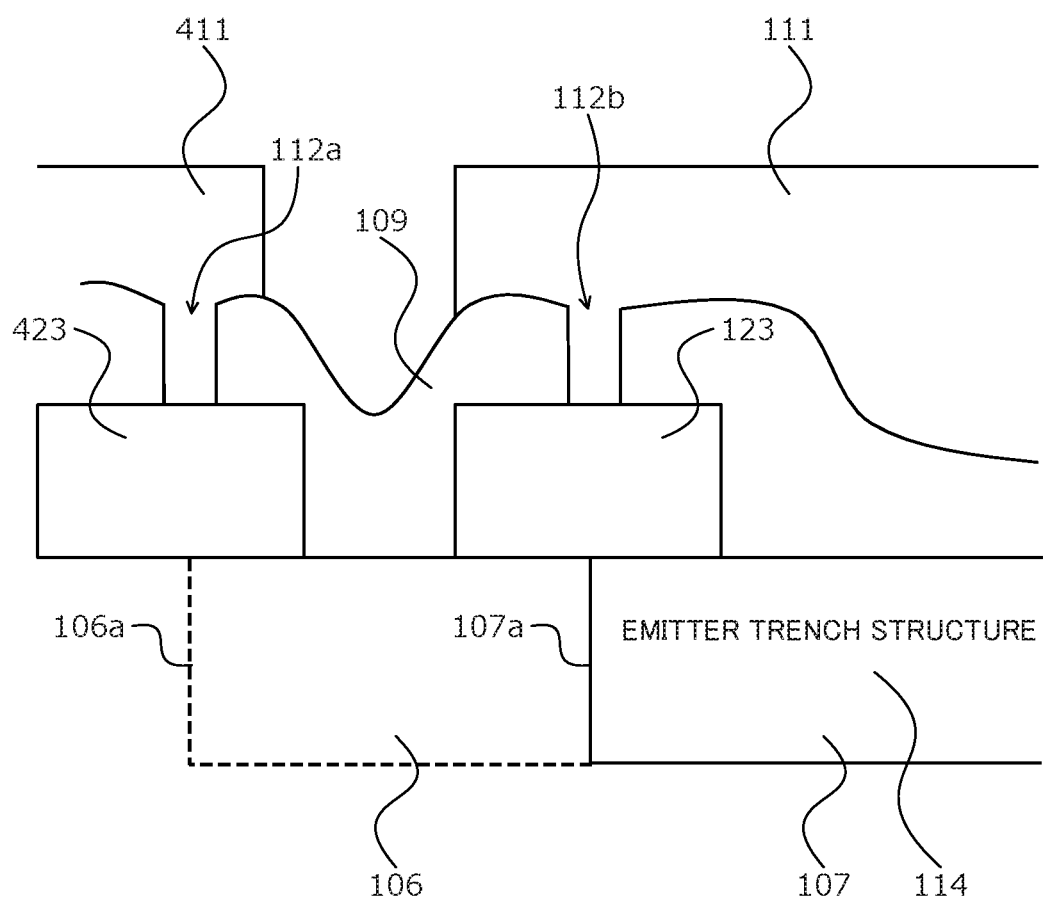

FIGS. 9 and 10 are schematic diagrams of an end portion of the emitter trench structure 107 in the RC-IGBT according to the comparative example. FIG. 9 is a plan view depicting a chip end portion 100B of a semiconductor device 100, and FIG. 10 is a sectional view along a line A-A' in FIG. 9.

In the chip end portion 100B, a gate electrode 411 connected with a gate runner 400 is provided on a front surface of the semiconductor device 100. An end portion 106a of the gate trench structure 106 in the IGBT regions 121 is formed to extend to a connection portion 423 such as polysilicon, and the electrode of the end portion 106a is conductively connected to the gate electrode 411 via a contact hole 112a opened in the interlayer insulating film 109 on the connection portion 423. The gate trench structure 106 and the end portion 106a are indicated by a broken line in FIG. 10.

An end portion 107a of the emitter trench structure 107 in the FWD regions 122 does not extend to the end portion 106a of the gate trench structure 106 and is formed to reach a connection portion 123 such as polysilicon to the emitter electrode 111, which is located midway to the end portion 106a. The electrode 114 of the end portion 107a is conductively connected to the emitter electrode 111 via a contact hole 112b opened in the interlayer insulating film 109 on the connection portion 123.

Referring back to FIG. 8, the emitter electrode 111, the interlayer insulating film 109, the contact plugs 110 (the contact holes 112), the trench structures 104, the p-type base regions 103, the n-type regions 102, the $n^-$-type drift layer 101, n-type field-stop layers 130, and the collector electrode 133 are provided in the IGBT regions 121 and the FWD regions 122 overall. The $n^+$-type emitter regions 108 and the $p^+$-type collector regions 131 are provided in the IGBT regions 121 overall. $p^+$-type regions 115 and the $n^+$-type cathode regions 132 are provided in the FWD regions 122 overall.

In the FWD regions 122, each of the trench structures 104 is the emitter trench structure 107 fixed to the emitter potential. The $p^+$-type regions 115 and the emitter electrode 111 are provided on the p-type base regions 103 and also function as p-type anode regions and an anode electrode of an FWD.

In the configuration example depicted in FIG. 8, the n-type field-stop layers 130 are provided on a rear surface side of the $n^-$-type semiconductor substrate in the depth direction. On a rear surface side of the n-type field-stop layers 130, the $p^+$-type collector region 131 is provided in each of the IGBT regions 121 and the $n^+$-type cathode region 132 is provided in each of the FWD regions 122. The collector electrode 133 functions also as a cathode electrode and is in contact with the $p^+$-type collector regions 131 and the $n^+$-type cathode regions 132.

The RC-IGBT described above has a collector-emitter gate capacitance (a drain-source capacitance Cds) between the emitter trench structures 107 in the IGBT regions 121 and the collector electrode 133. The drain-source capacitance Cds is also present between the emitter trench structures 107 in the FWD regions 122 and the collector electrode 133 (the cathode electrode). In the FWD regions 122, all the trench structures 104 are the emitter trench structures 107 and the drain-source capacitance Cds is presumed to increase by an active area.

FIG. 11 is a sectional view for explaining a problem of the RC-IGBT according to the comparative example. In the RC-IGBT according to the comparative example, the emitter trench structures 107 are connected to the emitter electrode 111 and are always 0 (zero) volts. At the time of turn-on, a hole accumulation layer H is formed near the emitter trench structures 107 due to a voltage difference between a voltage in the device and the emitter potential (0 volts). Holes pass through the accumulation layer H and conductivity modulation is prevented from occurring easily.

Accordingly, the voltage at the time of turn-on has a tailing shape, which causes a problem in that the turn-on power loss Eon is increased. In the RC-IGBT, all the trench structures 104 in the FWD regions 122 are the emitter trench structures 107. Therefore, the RC-IGBT has a problem in that the turn-on power loss Eon increases more than in a semiconductor device having an IGBT and an FWD separately.

Furthermore, in the comparative example, the drain-source capacitance Cds cannot be adjusted variably and the turn-on power loss Eon cannot be set to an arbitrary value.

FIGS. 1A and 1B are sectional views depicting a configuration example of an RC-IGBT according to a first embodiment. A basic structure of an RC-IGBT in the semiconductor device 100 depicted in FIGS. 1A and 1B is a same as a basic structure of the RC-IGBT according to the comparative example (see FIGS. 8 to 11).

In the RC-IGBT, the MOS gate (an insulated gate including a metal-oxide-semiconductor) structure 120 of a trench gate type is provided on a front surface of an n⁻-type semiconductor substrate constituting the n⁻-type drift layer 101 in the IGBT regions 121 that are first element regions in which insulated gate bipolar transistors are provided.

The MOS gate structure 120 includes the trench structures 104 formed on a front surface side of the n⁻-type semiconductor substrate, the n-type regions 102 and the p-type base regions 103 provided between adjacent ones of the trench structures 104, the n⁺-type emitter regions 108 provided on the p-type base regions 103, the interlayer insulating film 109 provided on the n⁺-type emitter regions 108 and including the contact holes 112, and the emitter electrode 111 connected with the n⁺-type emitter regions 108 via the contact holes 112, and the contact plugs 110 of tungsten (W) or the like are embedded in the contact holes 112. Each of the trench structures 104 includes the trench 113, the insulating film 105 provided in the trench 113, and the electrode 114 provided on the insulating film 105. The trench structures 104 include the gate trench structures 106 each including the electrode 114 based on a gate potential, and the emitter trench structures 107 each including the electrode 114 based on an emitter potential.

The trench structures 104 (the trenches 113) are, for example, arranged in a striped shaped along a direction extending in a direction (the depth direction of FIGS. 1A and 1B) orthogonal to the width direction (the lateral direction in FIGS. 1A and 1B) in which the IGBT regions (the first element regions) 121 and the FWD regions 122 being second element regions in which diodes are provided are arranged, as viewed from a front surface side of the semiconductor device (semiconductor wafer) 100. The emitter electrode 111 is electrically connected to the n⁺-type emitter regions 108 in the IGBT regions 121.

The n-type regions 102 (channel stop layer) have a function to serve as a barrier for minority carriers (holes) in the n⁻-type drift layer 101 and accumulate the minority carriers in the n⁻-type drift layer 101 at the time of turn-on of the IGBT. The gate trench structures 106 and the emitter trench structures 107 are formed in the IGBT regions 121. For example, the gate trench structures 106 and the emitter trench structures 107 are alternately arranged. Each of the gate trench structures 106 has, for example, a structure in which the electrode 114 of polycrystalline silicon is embedded, via the insulating film 105. Connection of the polycrystalline silicon electrode 114 to the gate electrode 411 (see FIG. 10) via the connection portion 423 (see FIG. 10) enables the potential to be fixed at a gate potential.

Each of the emitter trench structures 107 also has, for example, a structure in which the electrode 114 of polycrystalline silicon is embedded, via the insulating film 105. Connection of the polycrystalline silicon electrode 114 to the emitter electrode 111 (see FIG. 10) via the connection portion 123 (see FIG. 10) enables the potential to be fixed at an emitter potential.

The emitter electrode 111, the interlayer insulating film 109, the contact plugs 110 (the contact holes 112), the trench structures 104, the p-type base regions 103, the n-type regions 102, the n⁻-type drift layer 101, the n-type field-stop layers 130, and the collector electrode 133 are provided in the IGBT regions 121 and the FWD regions 122 overall. These elements may be provided to have a predetermined distance therebetween in the width direction. However, it is not always necessary to provide all of these elements at a predetermined distance. There may be some areas in which these elements are not provided. Firstly, these elements do not need to be provided at predetermined distances. Alternatively, these elements may be provided at a different predetermined distance at portions of the boundaries O. The n⁺-type emitter regions 108 and the p⁺-type collector region 131 are provided in the IGBT regions 121 overall. The p⁺-type regions 115 and the n⁺-type cathode region 132 are provided in the FWD regions 122 overall.

Also in the configuration example of FIGS. 1A and 1B, the n-type field-stop layers 130 are provided on the rear surface side of the n⁻-type semiconductor substrate in the depth direction. On a rear surface of the n-type field-stop layers 130, the p⁺-type collector region 131 is provided in the IGBT regions 121 and the n⁺-type cathode region 132 is provided in the FWD regions 122. However, a configuration in which the n-type field-stop layers 130 are not provided may be used or any number of the n-type field stop layers 130 may be provided. Further, configuration may be such that the n-type field-stop layers 130 are provided only in the IGBT regions 121. In this example, the n-type field-stop layers 130 are formed by irradiating protons multiple times to cause the n-type field-stop layers 130 to equivalently function as one broad n-type field-stop layer. However, n-type field-stop layers may be formed at a deep position in the substrate by irradiating a polished face on the rear surface of the wafer with n-type impurities such as phosphorus or arsenic and annealing the substrate at an appropriate temperature. Alternatively, n-type field-stop layers of selenium or sulfur may be formed.

Provision of the n-type field-stop layers 130 enables a depleted layer extending from pn junctions between the p-type base regions 103 and the n-type regions 102 to be stopped and suppressed from reaching the p⁺-type collector region 131 in the off state, so that the on-voltage may be reduced. Further, the thickness of the n⁻-type drift layer 101 may be reduced. The collector electrode 133 also serves as a cathode electrode and is in contact with the p⁺-type collector region 131 and the n⁺-type cathode region 132.

In the configuration example of FIG. 1A, the FWD regions 122 include the emitter trench structures 107 each including the electrode 114 based on an emitter potential, and floating trench structures 116 each including the electrode 114 having a floating potential, as the trench structures 104. Each of the floating trench structures 116 has, for example, a structure in which the electrode 114 of polycrystalline silicon is embedded, via the insulating film 105. The emitter trench structures 107 and the floating trench structures 116 are so-called dummy trench structures and each of which has the electrode 114 electrically isolated from a gate potential. The FWD regions 122 include the p+-type regions 115 and the emitter electrode 111 on the p-type base regions 103, which function also as p-type anode regions and an anode electrode in the FWD regions 122. The contact plugs 110 of tungsten (W) or the like are embedded also in the contact holes 112 in the interlayer insulating film 109 of the FWD regions 122.

Use of Ai-Si as an electrode material for the emitter electrode 111 enables satisfactory ohmic contact with the p-type base regions 103 in the IGBT regions 121. Further, the use of Ai-Si as an electrode material for the emitter electrode 111 also enables in the FWD regions 122, satisfactory ohmic contact with the p+-type regions 115 (the p-type anode regions).

In the configuration example of FIG. 1A, among the trench structures 104 arranged in the FWD regions 122, the emitter trench structures 107 and the floating trench structures 116 are alternately arranged. Alternatively, all the trench structures 104 in the FWD regions 122 may be the floating trench structures 116 as in the configuration example of FIG. 1B. In the number of all the trench structures 104 in the FWD regions 122, a ratio of the number of the emitter trench structures 107 connected to the emitter electrode 111 to the number of the floating trench structures 116 not connected to the emitter electrode 111 may be arbitrarily changed.

A point that the drain-source capacitance Cds varies due to the gate trench structures 106 and the emitter trench structures 107 in the IGBT regions 121 as well as due to formation of the floating trench structures 116 in the FWD regions 122 is described below. Replacing the emitter trench structures 107 in the FWD regions 122 with the floating trench structures 116 changes the value of the drain-source capacitance Cds.

Assuming that the ratio of the emitter trench structures 107 in the IGBT regions 121 is $\alpha$, $\alpha=0$: when all the trench structures 104 in the IGBT regions 121 are the gate trench structures 106, and $\alpha=1$: when all the trench structures 104 in the IGBT regions 121 are the emitter trench structures 107 (the device does not operate as an IGBT).

Assuming that the ratio of the floating trench structures 116 among the trench structures 104 in the FWD regions 122 is $\beta$, $\beta=0$: when all the trench structures 104 in the FWD regions 122 are the emitter trench structures 107 (the device is a general RC-IGBT), and $\beta=1$: when all the trench structures 104 in the FWD regions 122 are the floating trench structures 116.

Assuming that the ratio of the IGBT regions 121 among the IGBT regions 121 and the FWD regions 122 is $\gamma$, $\gamma=0$: when all the regions are the FWD regions 122, and $\gamma=1$: when all the regions are the IGBT regions 121.

In the above condition, a capacitance CdsT between the emitter trench structures 107 and the floating trench structures 116, and the collector electrode 133 in the drain-source capacitance Cds may be represented by expression 1 in a simplified manner. In this expression, $CdsT_0$ denotes a capacitance between the emitter trench structures 107 and the collector electrode 133 when $\gamma=1$ and $\alpha=1$, that is, when all the trench structures 104 in all the IGBT regions 121 are the emitter trench structures 107.

$$CdsT = CdsT_0 \times [\gamma \times \beta + (1-\gamma) \times (1-\beta)] \tag{1}$$

A combination of $\alpha$, $\beta$, and $\gamma$ may be a case where CdsT satisfies expressions 2 and 3. When CdsT is reduced to satisfy the expression 2, the turn-on power loss Eon may be reduced to a practical level. Because it is confirmed that CdsT having values within a range of the expression 3 causes no malfunction, reliability of the product may be ensured when CdsT is set to satisfy the expression 3.

$$CdsT/CdsT_0 \leq 3/4 \tag{2}$$

$$CdsT/CdsT_0 \geq 3/8 \tag{3}$$

Based on the above descriptions, $\alpha$, $\beta$, and $\gamma$ are set to arbitrary values and the drain-source capacitance Cds having an arbitrary value may be obtained based on the corresponding ratio between the trench structures 104 (the ratio of the emitter trench structures 107) in the IGBT regions 121 and the floating trench structures 116 in the FWD regions 122, and also based on the ratio between the IGBT regions 121 and the FWD regions 122.

For example, when $\alpha=0.5$, the ratio between the gate trench structures 106 and the emitter trench structures 107 in the IGBT regions 121 is 1:1. Therefore, the trench structures may be alternately arranged, or a region including the plural gate trench structures 106 and a region including the plural emitter trench structures 107 may be formed. When $\beta=0.5$, it suffices that the ratio in the number between the emitter trench structures 107 and the floating trench structures 116 in the FWD regions 122 is set to 1:1 to arrange these structures as in the example of the IGBT regions 121.

FIG. 2 is a plan view of the RC-IGBT according to the first embodiment. As depicted in FIG. 2, in the semiconductor device 100 of the RC-IGBT, the IGBT regions 121 and the FWD regions 122 each has predetermined widths and are arranged alternately in the width direction. The ratio $\gamma$ of the IGBT regions 121 may be adjusted by setting these predetermined widths.

Figure 3:
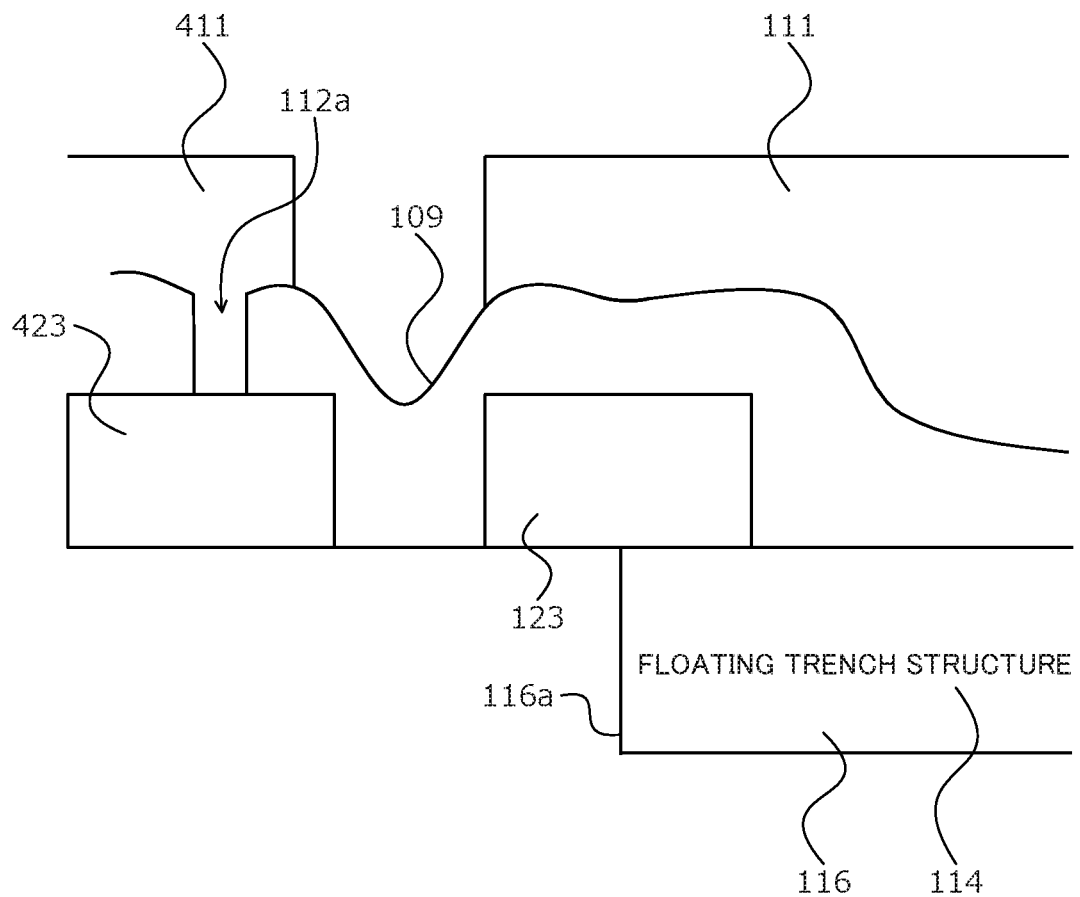
FIG. 3 is a sectional view of an end portion of a floating trench structure in the RC-IGBT of the first embodiment.

FIG. 3 is a schematic diagram of an end portion 116a of one of the floating trench structures 116 in the FWD regions 122 in the RC-IGBT of the first embodiment. FIG. 3 is a sectional view of the end portion 116a of the floating trench structure 116 in the FWD regions 122 along the line A-A' in the plan view of FIG. 9.

In the first embodiment, in the floating trench structures 116 in the FWD regions 122, no contact hole 112b (see FIG. 10) is opened in the interlayer insulating film 109 on the connection portion 123 located at the end portion 116a as depicted in FIG. 3. Accordingly, the electrodes 114 of the floating trench structures 116 may be brought into a floating state without being conducted with the emitter electrode 111.

Figure 4:
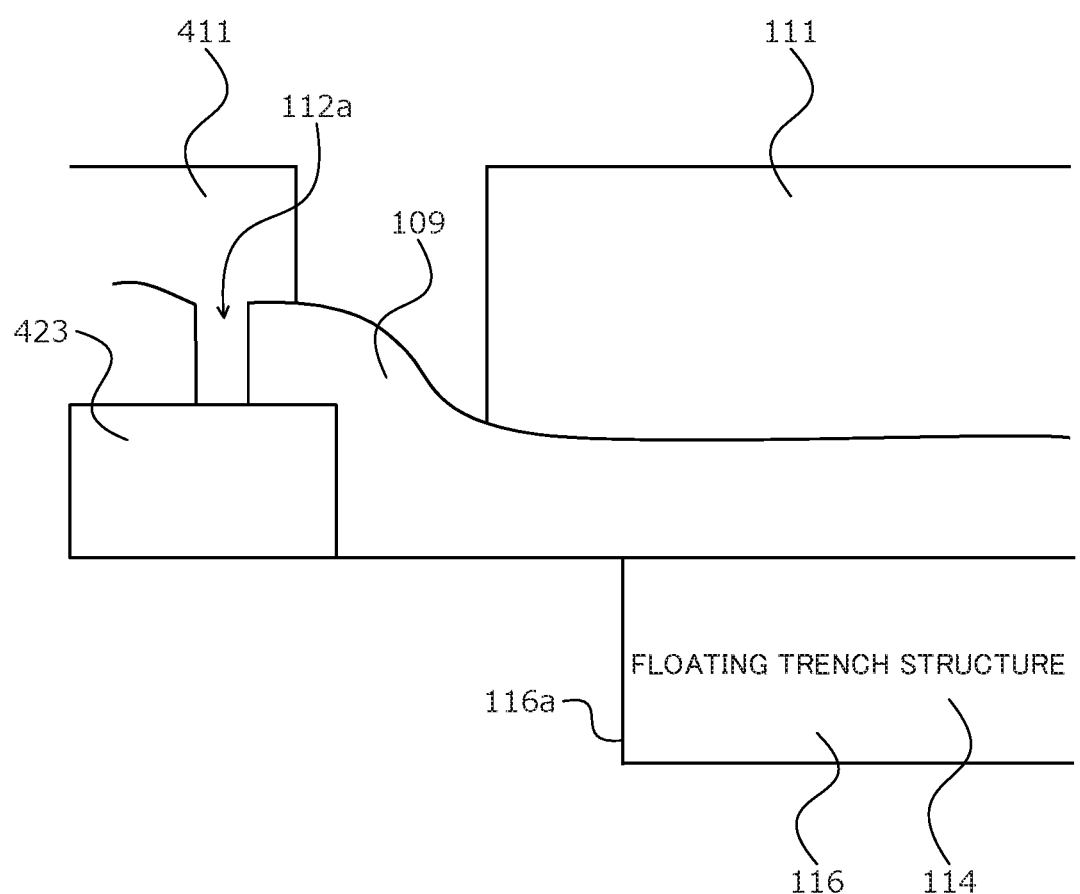
FIG. 4 is a sectional view of another end portion of the floating trench structure in the RC-IGBT of the first embodiment.

FIG. 4 is a schematic diagram of another end portion 116a of the floating trench structure 116 in the FWD regions 122 in the RC-IGBT of the first embodiment. As indicated by the configuration example of FIG. 4, a front surface of the end portion 116a of the floating trench structure 116 may be configured to be covered by the interlayer insulating film 109 without forming the connection portion 123 on the end portion 116a of the floating trench structure 116. This enables the floating trench structures 116 to be brought into a floating state without being conducted with the emitter electrode 111.

According to the above configuration examples, the ratio $\beta$ of the floating trench structures 116 among the trench structures 104 in the FWD regions 122 may be easily adjusted based on whether to conductively connect the end portions 107a and 116a of the FWD regions 122 to the emitter electrode 111.

Figure 5:
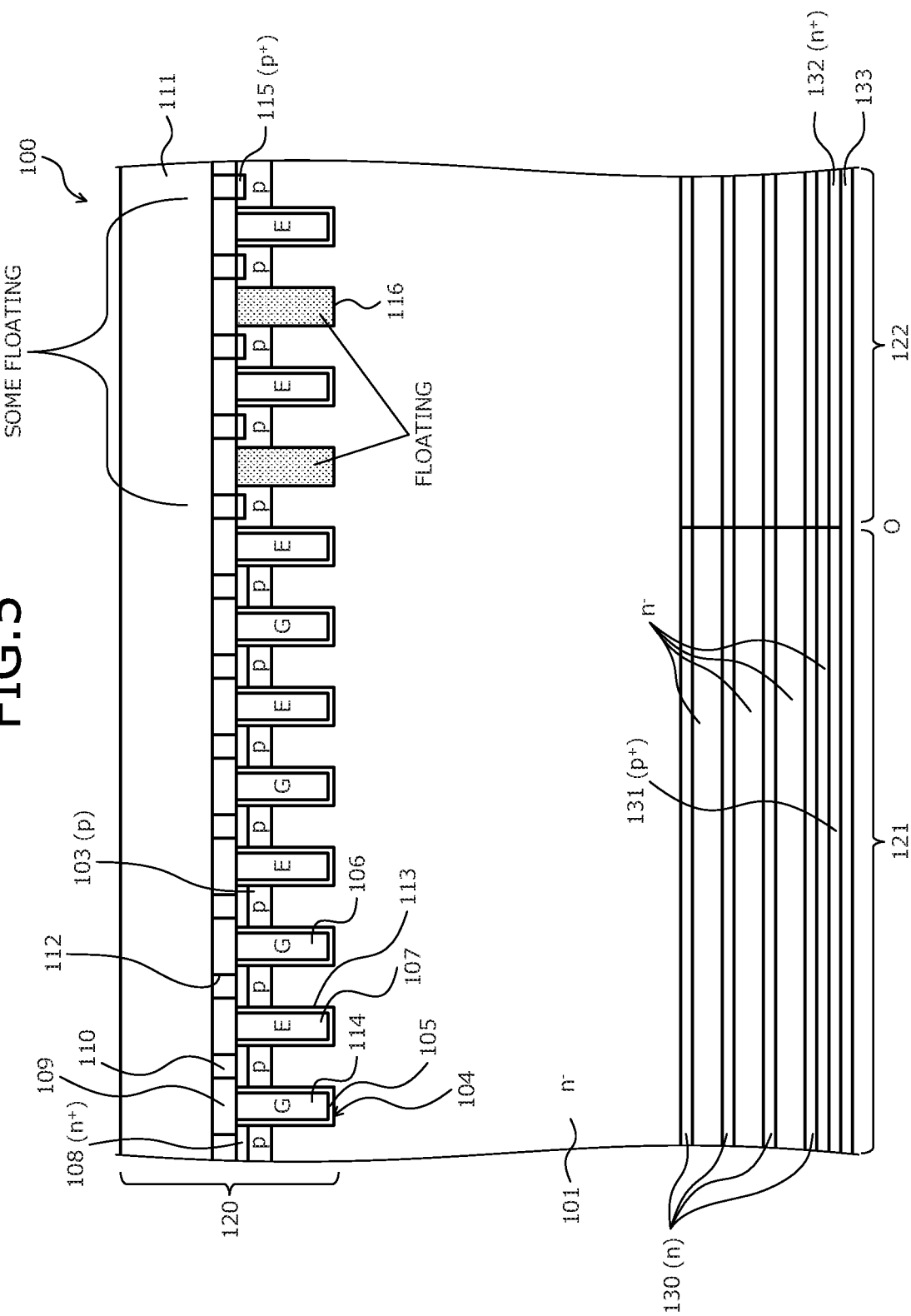
FIGS. 5 and 6 are sectional views depicting other configuration examples of the RC-IGBT of the first embodiment.
Figure 6:
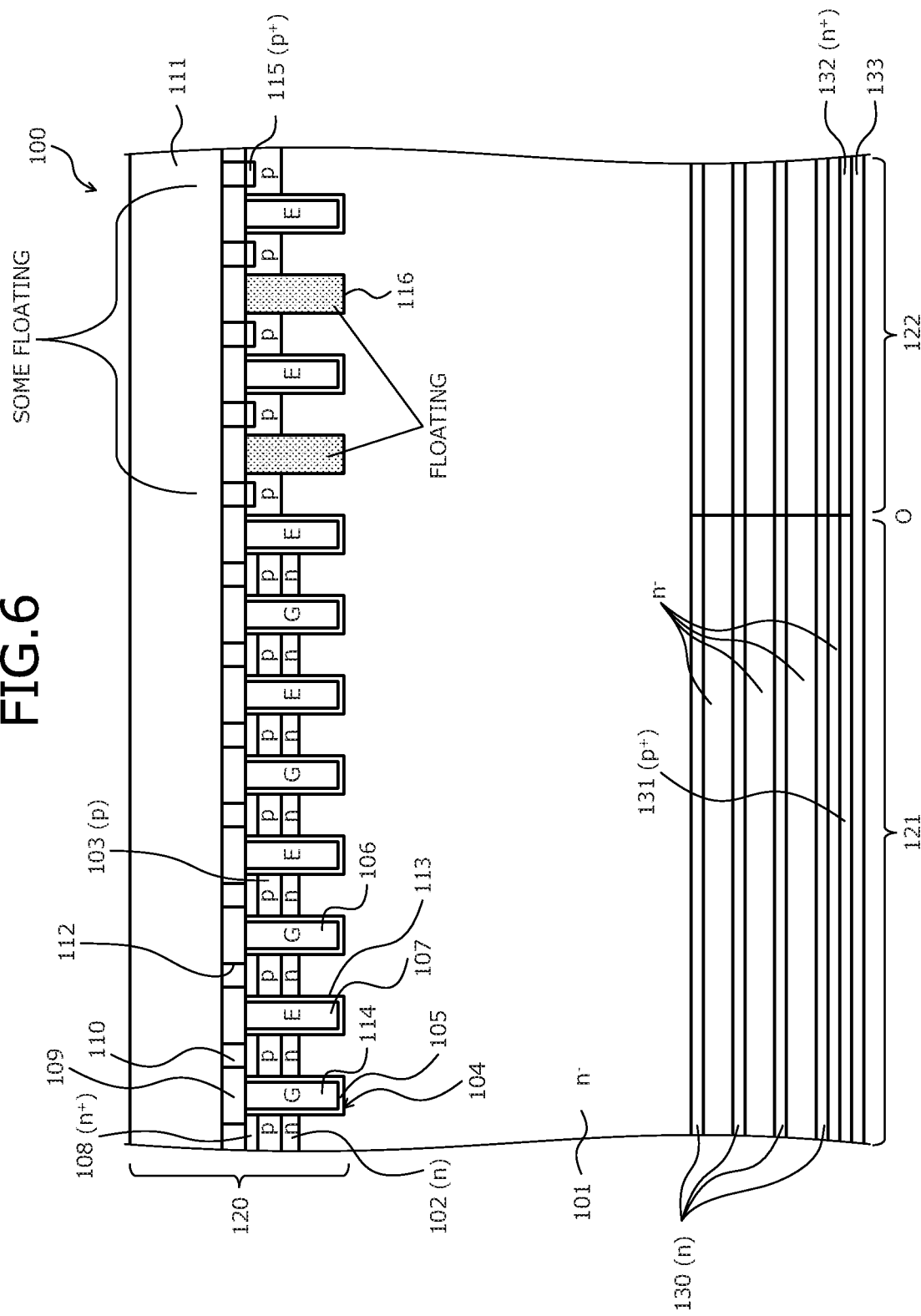

FIGS. 5 and 6 are sectional views depicting other configuration examples of the RC-IGBT of the first embodiment. In the configuration example of FIG. 5, the n-type regions 102 provided in FIGS. 1A and 1B to function as a channel-stop layer are not provided. In FIG. 6, the n-type regions 102 are provided only in the IGBT regions 121 and are not provided in the FWD regions 122.

The amount of minority carriers accumulating in the n⁻-type drift layer 101 may be changed by these configurations in which the n-type regions 102 on the surface side of the n⁻-type drift layer 101 are not provided in a part of an area or in the entire area. Accordingly, the turn-on power loss Eon may be changed.

According to the above configurations, some of the emitter trench structures 107 connected to the emitter electrode 111 are replaced with the floating trench structures 116 in the FWD regions 122, so that no hole accumulation layer is formed in the floating trench structures 116 at the time of turn-on. Accordingly, the conductivity modulation becomes more likely to occur and the turn-on power loss Eon may be reduced.

Furthermore, in the RC-IGBT, the drain-source capacitance Cds at a low voltage (a collector-emitter voltage) is particularly larger than the drain-source capacitance Cds in an IGBT as a single unit. With the above configuration, the drain-source capacitance Cds of an arbitrary value may be obtained by forming the trench structures 104 corresponding to the parameters α, β, and γ. For example, in an experimental example, the drain-source capacitance Cds was changed with the collector-emitter voltage at 0.5 volt or lower and the capacitance at 3.5 to 14.5 nF.

According to the first embodiment described above, a configuration in which at least some of the dummy trench structures connected to the emitter electrode 111 in the FWD regions 122 of the RC-IGBT are replaced by the floating trench structures 116 is obtained, whereby the drain-source capacitance Cds may be reduced. Therefore, the hole accumulation layer is not formed near the floating trench structures 116 during operation of the IGBT, the conductivity modulation occurs more easily, and the turn-on power loss Eon may be reduced. Further, by increasing or decreasing the number of the floating trench structures 116 among the dummy trench structures, the drain-source capacitance Cds may be correspondingly changed to an arbitrary value.

The floating trench structures 116 may each has a configuration in which the inner part of the trench 113 is filled with an insulating material, as well as the configuration in which the electrode 114 of the end portion 116a is insulated without connecting to the emitter electrode 111.

Figure 7:
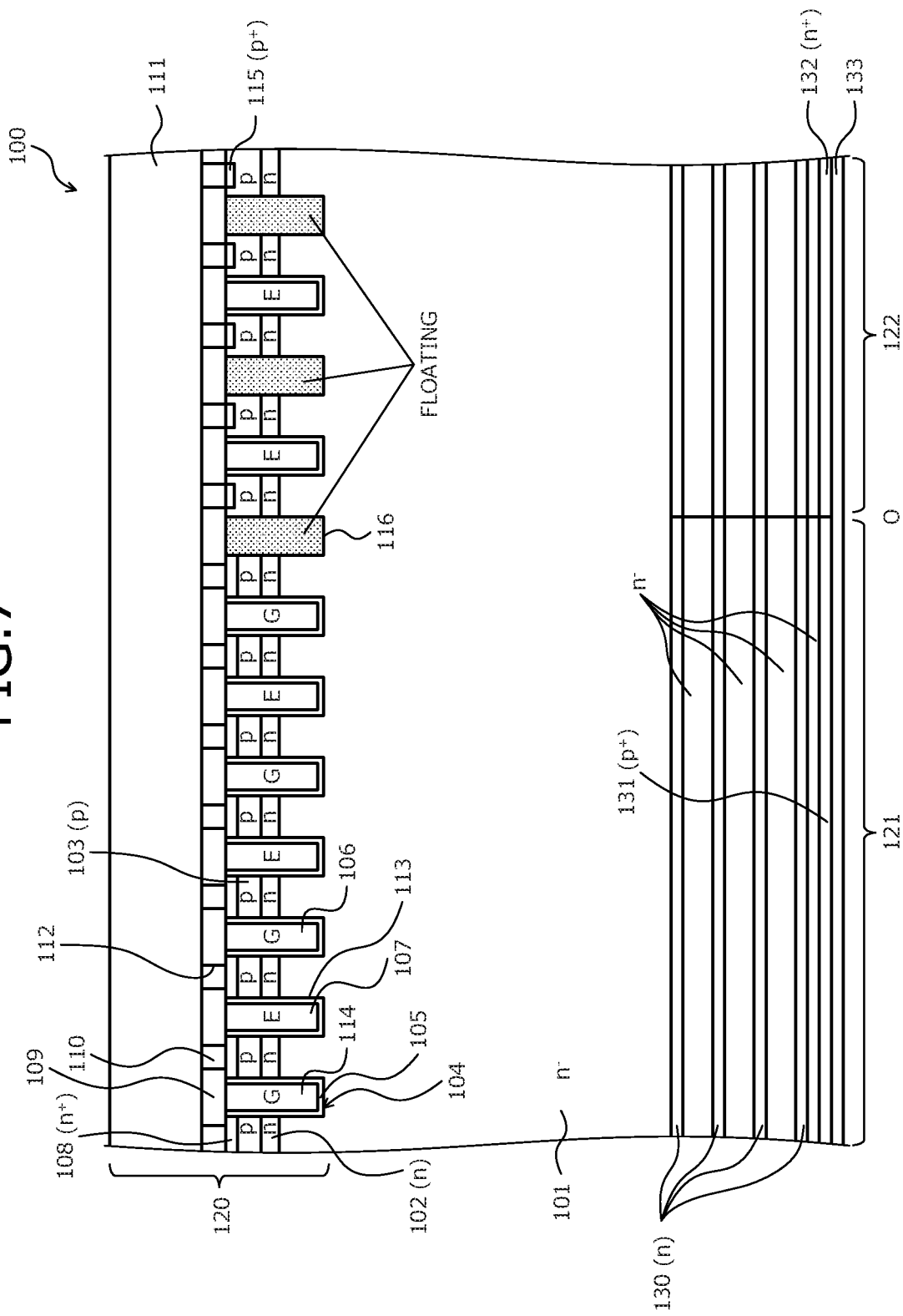
FIG. 7 is a sectional view depicting a configuration example of an RC-IGBT according to a second embodiment.

FIG. 7 is a sectional view depicting a configuration example of an RC-IGBT according to a second embodiment. The second embodiment is a modification of the configuration described in the first embodiment (FIGS. 1A and 1B). As depicted in FIG. 7, the floating trench structures 116 are provided also in the IGBT regions 121 in the second embodiment. Accordingly, the drain-source capacitance Cds may be reduced further and the turn-on power loss Eon may be reduced further. However, more floating trench structures 116 may be provided in the FWD regions 122 than in the IGBT regions 121. The trench structure 104 adjacent to the boundary O between the IGBT region 121 and the FWD region 122 on the side of the IGBT region 121 may be the floating trench structure 116 as in the second embodiment, or other trench structures 104 in the IGBT regions 121 may be the floating trench structures 116.

The present invention is not limited to the embodiments described above, and may be variously changed without departing from the spirit of the present invention.

According to the present invention, the turn-on power loss Eon of an RC-IGBT may be reduced.

As described above, the semiconductor device according to the present embodiment is, for example, useful for a power semiconductor element such as a power device, or a power semiconductor element to be used for industrial motor control or engine control.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate including
        a first element region for forming an insulated gate bipolar transistor therein, and
        a second element region for forming a diode therein, the semiconductor substrate constituting a drift layer; and
    a plurality of trench structures formed on the semiconductor substrate, including
        a plurality of gate trench structures provided on a front surface side of the first element region, each gate trench structure having an electrode provided therein that is based on a gate potential,
        a plurality of emitter trench structures provided on the front surface side of the first element region, each emitter trench structure having an electrode provided therein that is based on an emitter potential, and
        a plurality of floating trench structures provided at least on a front surface side of the second element region, each floating trench structure having an electrode provided therein that has a floating potential, the floating trench structures being larger in number in the second element region than in the first element region, wherein
    the plurality of floating trench structures are provided on the second element region only, and
    the plurality of emitter trench structures are not provided on the second element region.

2. The semiconductor device according to claim 1, wherein each of the trench structures includes
    a trench,
    an insulating film provided in the trench, and
    the electrode provided on the insulating film.

3. The semiconductor device according to claim 1, wherein the plurality of emitter trench structures are provided also on the front surface side of the second element region.

4. The semiconductor device according to claim 3, further comprising:
    an interlayer insulating film provided on the plurality of trench structures in the first and second element regions, and
    an emitter electrode provided on the interlayer insulating film, wherein
    the interlayer insulating film includes a plurality of contact holes,
    end portions of the emitter trench structures are connected with the emitter electrode via the contact holes, and
    the floating trench structures are insulated from the emitter electrode by the interlayer insulating film.

5. The semiconductor device according to claim 3, further comprising:
    a collector electrode on a rear surface of the semiconductor substrate, wherein
    a gate capacitance CdsT between the emitter trench structures and the floating trench structures, and the collector electrode satisfies $CdsT/CdsT_0 \leq 3/4$, where $CdsT_0$ is the gate capacitance in a case where only the first element region is provided in the semiconductor device and only the emitter trench structures are formed in the first element region.

6. The semiconductor device according to claim 3, wherein the floating trench structures are provided also in the first element region.

7. The semiconductor device according to claim 1, wherein
   the semiconductor substrate is of a first conductivity type; and
   the semiconductor device further includes, in the first element region,
      a base region of a second conductivity type provided between adjacent ones of the trench structures in the first element region, and
      an emitter region of the first conductivity type provided on the base region.

8. The semiconductor device according to claim 1, wherein
   the plurality of floating trench structures are not provided on the first element region and are provided on the second element region.

* * * * *